United States Patent [19]

Reed

[11] 4,001,714
[45] Jan. 4, 1977

[54] SEARCH AND CONFIRM FREQUENCY SYNTHESIZER

[75] Inventor: Francis K. Reed, Scottsdale, Ariz.

[73] Assignee: Motorola Inc., Chicago, Ill.

[22] Filed: Nov. 12, 1975

[21] Appl. No.: 631,349

[52] U.S. Cl. .................................. 331/4; 331/19; 331/25; 331/44
[51] Int. Cl.$^2$ ........................................ H03B 3/04
[58] Field of Search ................... 331/4, 19, 25, 44

[56] References Cited

UNITED STATES PATENTS

| | | | |
|---|---|---|---|
| 3,676,794 | 7/1972 | Bidell et al. | 331/19 X |
| 3,694,766 | 9/1972 | Boelke | 331/25 X |
| 3,848,199 | 11/1974 | Weber | 331/4 |
| 3,904,980 | 9/1975 | Hugenholtz | 331/4 |
| 3,916,334 | 10/1975 | Hugenholtz | 331/4 |

*Primary Examiner*—Siegfried H. Grimm
*Attorney, Agent, or Firm*—Eugene A. Parsons

[57] ABSTRACT

A search and confirm frequency synthesizer for generating an output frequency which is a multiple of a predetermined reference frequency is disclosed. A first means is provided for generating a reference frequency signal. A second means is provided for generating a comparison frequency signal. A first spectrum generator means is coupled to the first means and produces a plurality of harmonics of the reference frequency signal. A second spectrum generator means is coupled to the second means and produces a plurality of harmonics of the comparison frequency signal. Means including a phase-locked loop and feedback and control circuitry is operatively coupled to the first and second spectrum generator means for controlling the operation of the phase-locked loop to produce an output signal having a frequency equal to a selected harmonic of the reference frequency signal. As a further feature of the disclosed apparatus the first means for generating a reference signal and the second means for generating a comparison frequency signal can be crystal oscillators.

3 Claims, 2 Drawing Figures $f_r = 6.000000$ MHz   $f_c = 5.962963$ MHz

| N | $f_A = n \times f_r$ MHz | $f_B = mf_c$ MHz | $f_B - f_A$ MHz |
|---|---|---|---|
| 86 | 516 | 518.77777 | 2.77777 |
| 87 | 522 | 524.74074 | 2.74074 |
| 88 | 528 | 530.70370 | 2.70370 |
| 89 | 534 | 536.66667 | 2.66667 |
| --- | --- | --- | --- |
| 153 | 918 | 918.29629 | 0.29629 |
| 154 | 924 | 924.25926 | 0.25926 |
| 155 | 930 | 930.22222 | 0.22222 |

SEARCH AND CONFIRM FREQUENCY SYNTHESIZER

BACKGROUND OF THE INVENTION

This invention relates to frequency synthesizers, and more particularly, to search and confirm frequency synthesizers (SCFS) containing two spectrum generators and a phase-locked loop.

The closest known prior art is disclosed in the Boelke patent (U.S. Pat. No. 3,694,766). Bielke discloses a frequency synthesizer having a single crystal oscillator coupled to a pair of dividers each of which generates a single frequency to be fed to a harmonic generator.

There are a number of inherent disadvantages to using frequency divider circuits in frequency synthesizers. Frequency dividers are expensive, complex, and have a relatively high D.C. power drain.

If it is desired to use the frequency synthesizer disclosed by Boelke to generate a frequency on the order of 1 gigahertz, the oscillator 10 shown in FIG. 1 of the Boelke patent must operate at a frequency approaching 1 gigahertz also. This is necessitated by the fact that the $\Delta f$ frequency differential which is produced by the second divider 25 must be kept extremely small so that the harmonic generator output (designated by the formula $n(f_r + \Delta f)$) when mixed with the $nf_r$ signal will be within the pass band of the lowpass filter 28. For operation in the gigahertz frequency range both divider 11 and divider 25 must divide the oscillator 10 output frequency down to a relatively low frequency (no more than a few megahertz) so that the frequency spacing between each harmonic will be small. This requires extremely high speed frequency dividers and utilizes considerable DC primary power. Although the Boelke apparatus might be highly acceptable for generating relatively low frequency output signals, it can be seen that for use in the UHF range that an apparatus of this design has serious disadvantages.

SUMMARY OF THE INVENTION

It is an object of this invention to provide a frequency synthesizer capable of generating frequencies from 10 Megahertz to 1 gigahertz and higher.

Another object of this invention is to provide a frequency synthesizer which does not require high speed digital logic circuitry.

A further object of this invention is to provide a frequency synthesizer having relatively low DC power consumption.

Briefly stated, and in accord with one embodiment of the invention, a search and confirm frequency synthesizer is provided for generating an output signal having a frequency equal to a selected harmonic of a reference signal. The frequency synthesizer includes two crystal oscillators, one for generating a reference frequency signnal and the other for generating a comparison frequency signal. A first spectrum generator is coupled to the crystal oscillator which generates the reference frequency and produces a plurality of harmonics of the reference frequency signal. A second spectrum generator is coupled to the crystal oscillator which generates the comparison frequency signal and produces a plurality of harmonics of the comparison frequency signal. The frequency synthesizer further includes a voltage controlled oscillator and a phase detector which has a first input coupled to the first spectrum generator and a second input coupled to the output of the voltage controlled oscillator. A loop filter and sweep generator has a first input coupled to the output of the phase detector and an output coupled to the input of the voltage controlled oscillator. The phase detector, loop filter and sweep generator, and voltage controlled oscillator form a phase-locked loop for sequentially generating progressively increasing or decreasing harmonic frequencies of the reference frequency signal. A frequency mixer is coupled to the output of the second spectrum generator and to the output of the voltage controlled oscillator for mixing the plurality of harmonics of the comparison frequency signal with each sequentially generated harmonic of the reference frequency signal. A low-pass filter is coupled to the output of the frequency mixer and transmits only the single lowest frequency difference signal produced by the frequency mixer. A difference frequency counter is coupled to the low-pass filter to determine the frequency of the difference signal and to transmit a numerical representation of that frequency to a control circuit. The control circuit is coupled to the difference frequency counter, the comparison frequency crystal oscillator and the loop filter and sweep generator. The control circuit also has an input to receive an encoded frequency select input signal for comparing the numerical representation of the difference signal with the encoded frequency select input signal for turning on the comparison frequency crystal oscillator during changes in the output frequency of the frequency synthesizer and for controlling the operation of the phase-locked loop in order to produce an output signal having a frequency equal to a selected harmonic of the reference frequency signal.

BRIEF DESCRIPTION OF THE DRAWING

The invention is pointed out with particularity in the appended claims. However, other objects and advantages, together with the operation of the invention, may be better understood by reference to the following detailed description taken in connection with the following illustrations wherein:

DETAILED DESCRIPTION OF THE INVENTION

Figures 1, 2:
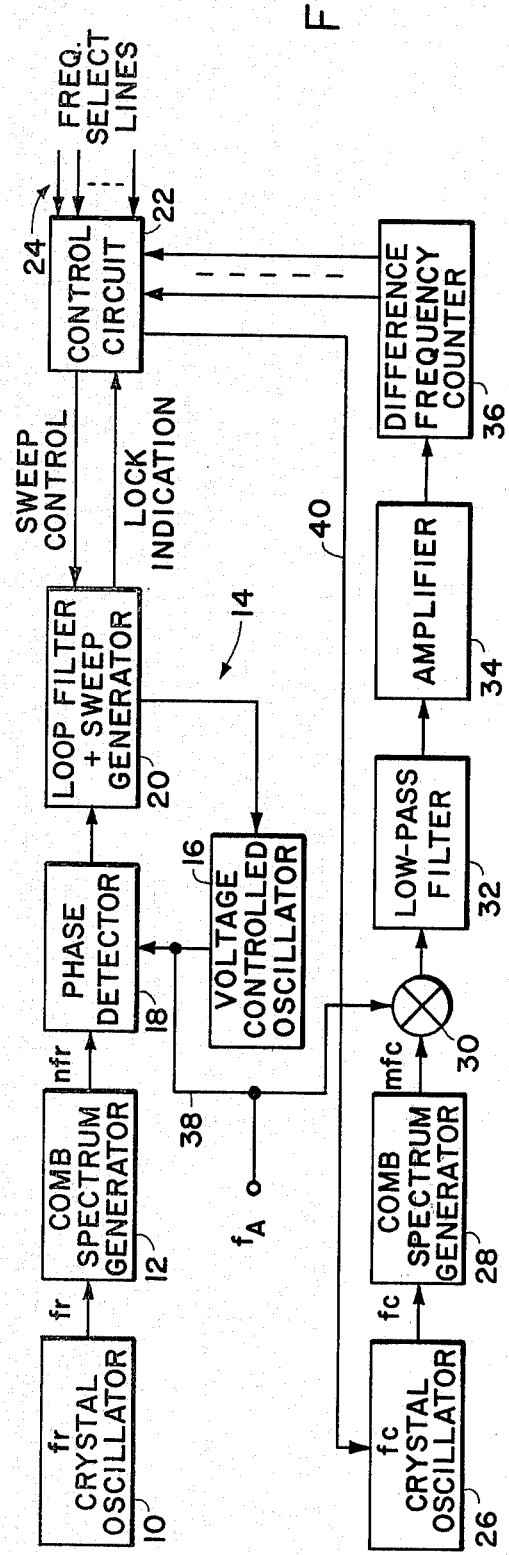
FIG. 1 is a generalized block diagram of one possible hardware embodiment of the invention.
FIG. 2 is a table showing the relationship between the harmonics of $f_r$ and $f_c$ and the output frequency $f_A$.

In order to better illustrate the advantages of the invention and its contribution to the art, a preferred hardware embodiment of the invention will now be described in some detail.

The frequency synthesizer in accordance with the invention, as illustrated in FIG. 1, includes a reference frequency crystal oscillator 10 which should be a highly stable crystal oscillator. The oscillator output signal $f_r$ is coupled to a comb spectrum generator 12. Spectrum generator 12 generates a spectrum of output signals which are multiples of harmonics of the input frequency $f_r$.

The spectrum of harmonics is applied to a phase-locked loop 14 of generally known type. The phase-locked loop 14 includes a voltage controlled oscillator 16 which produces an output frequency signal which is a function of its input voltage. The phase-locked loop 14 also includes a phase detector 18 having a first input connected to the output of the spectrum generator 12 and a second input connected to the output of the voltage controlled oscillator 16. The phase-locked loop 14 is tuned by loop filter and sweep generator circuit 20 which is responsive to the error signal produced by the phase detector 18. The error signal is filtered by the loop filter portion of the circuit. Loop filter and sweep generator 20 receives a sweep control input from control circuit 22. The output of loop filter and sweep generator 20 controls the voltage controlled oscillator 16. Control circuit 22 receives a frequency select input signal on a plurality of frequency select lines 24.

The frequency synthesizer circuit includes comparison signal generator circuit 26 which may be a highly stable crystal oscillator. The comparison frequency signal $f_c$ is applied to a second comb spectrum generator 28 which generates a spectrum of output signals which are multiples or harmonics of the input frequency $f_c$.

The output signals from the second spectrum generator 28 are applied to the first input of a mixer 30. The output signal $f_A$ from the phase-locked loop 14 is coupled to the second input of mixer 30 by output conductor 38. The output of mixer 30 is coupled to low pass filter 32. The output of low pass filter 32 is amplified by amplifier 34. The output of amplifier 34 is coupled to difference frequency counter 36. The output of difference counter 36 is coupled to control circuit 22. Control circuit 22 is coupled to comparison frequency oscillator 26 for the purpose of turning the comparison oscillator off after phase-locked loop 14 has locked onto the desired output frequency. The mixer 30, low-pass filter 32, amplifier 34, difference frequency counter 36, and control circuit 22 basically function as a feedback and control network which control the operation of phase-locked loop 14.

The operation of the search and confirm frequency synthesizer (SCFS) as shown in FIG. 1 can best be understood by analyzing a typical use in the local oscillator of a UHF television tuner. The principles of operation will be explained by using the frequencies shown in FIG. 2 although the SCFS can be used for other frequency ranges as well.

Suppose it is desired to generate frequencies in the range of 516 MHz to 930 MHz which are selectable multiples of 6 MHz. A partial list of these frequencies is shown in the second column of FIG. 2 which is labelled $f_A = n \times f_r$. $n$, (the appropriate harmonic of $f_r$) or equivalent information capable of designating the desired output frequency is applied to control circuit 22 by means of a plurality of frequency select lines 24. The minimum frequency resolution or frequency spacing is determined by the frequency $f_r$. In this example $f_r$ equals 6 MHz since a frequency spacing of 6 MHz is desired. $f_c$ is chosen to be very slightly below $f_r$ in frequency.

After the desired output frequency has been designated by frequency select lines 24, the frequency synthesizer then proceeds with an automatic acquisition sequence which consists of sequentially locking the phase-locked loop 14 onto the harmonics of $f_r$ which are produced by spectrum generator 12. The control circuit 22 then determines whether the phase-locked loop 14 is locked onto the correct harmonic by measuring the difference frequency between the voltage controlled oscillator output frequency on line 38 and the nearest harmonic of the $f_c$ frequency generated by spectrum generator 28 through a comparison of the output of counter 36 and the input on frequency select lines 24.

Let us assume that the user of the frequency synthesizer desires to generate an output frequency $f_A$ of 516 MHz on output line 38. The frequency select lines 24 are used to designate the desired harmonic of the reference frequency $f_r$. The control circuit has been preprogrammed so that when an output frequency of 516 MHz is desired the control circuit 22 will search for an output from difference frequency counter 36 nearly equal to 2.777777 MHz as is indicated in the last column of FIG. 2.

The automatic acquisition sequence of the frequency synthesizer begins after initially dialing in the desired frequency on frequency select lines 24. Control circuit 22 by means of control line 40 then turns on the comparison frequency oscillator 26. The sweep control output of control circuit 22 controls the sweep generator function of loop filter and sweep generator 20. Loop filter and sweep generator 20 then causes voltage controlled oscillator 16 to begin a scan of the plurality of output frequencies from spectrum generator 12. When phase-lock loop 14 detects that voltage control oscillator 16 has zeroed in on one of the harmonic frequencies generated by spectrum generator 12 the phase-locked loop 14 stops the scan and maintains a frequency equal to that particular harmonic frequency from spectrum generator 12. Loop filter and sweep generator 20 generates a lock indication signal which is coupled to control circuit 22. The output of the phase-locked loop 14 is coupled to mixer 30 by means of output conductor 38. The output of spectrum generator 28 which consists of a plurality of harmonic frequencies of the comparison frequency is also coupled to mixer 30. Mixer 30 generates a plurality of sum and difference frequencies with respect to $f_A$ and each of the harmonics of $f_c$. Low pass filter 32 is designed to pass only the lowest possible difference frequency generated by mixer 30. In the present example the maximum difference frequency as indicated in the last column of FIG. 2 is equal to 2.777777 MHz. For an output frequency of 516 MHz no other difference frequencies have a value less than 2.777777 MHz.

Amplifier 34 amplifies the difference frequency selected by low pass filter 32. Difference frequency counter 36 measures the frequency of the output signal from amplifier 34. Difference frequency counter 36 produces a digital output and control circuit 22 compares this digital output with the difference frequency associated with the selected input frequency which is transmitted on frequency select lines 24.

In the example being used the operator of the UHF tuner will select the desired channel by reference to a channel number. The frequency select lines 24 will transmit this command to the control circuit 24 in terms of the associated difference frequency indicated in the last column of FIG. 2. To select a frequency of 516 MHz the frequency select lines 24 will cause the control circuit 22 to continue its automatic acquisition sequence until a difference frequency from difference counter 36 nearly equal to 2.777777 MHz is received. When that desired difference frequency is sensed by the control circuit 22 the automatic acquisition sequence terminates and the comparison frequency generator 26 is turned off by a command from the control circuit 22 which is transmitted on control line 40.

Until the desired difference frequency is sensed by the control circuit 22, the control circuit 22 by means of its sweep control output causes the phase-locked loop 14 to sequentially lock onto consecutive harmonic frequencies produced by spectrum generator 12. Each time the phase-locked loop 14 locks onto a harmonic frequency of $f_r$ a comparison is performed. This sequence is repeated until the desired output frequency is obtained.

The maximum difference frequency as indicated in the far right hand column of FIG. 2 is selected to be less than half of $f_r$. If this limitation were not imposed, improper output freguencies could be generated any time the difference frequency exceeded one half of the reference frequency. For instance, if a desired output frequency were designated by a difference frequency equal to 4.0 MHz, low pass filter 32 would have to be designed to pass a 4.0 MHz difference frequency. In that case whenever a difference frequency equal to 4.0 MHz was passed by low pass filter 32 a related difference frequency equal to 2.0 MHz would also be passed. This condition would result in unreliable operation of the frequency synthesizer.

Since the maximum difference frequency will always be less than one half of the reference frequency and since the reference frequency will not typically be an extremely high frequency, the difference frequency counter 36 will never have to measure very high frequencies. Since difference frequency counter 36 is the highest speed digital device in the frequency synthesizer it can be seen that no high speed digital circuitry will be required for use in this device.

It will be apparent to those skilled in the art that the disclosed search and confirm frequency synthesizer may be modified in numerous ways and may assume many embodiments other than the preferred form specifically set out and described above. For example, the range of output frequencies can be chosen to fall within any desired range and the frequency interval between output frequencies can be altered by proper selection of the reference frequency. Accordingly, it is intended by the appended claims to cover all such modifications of the invention which fall within the true spirit and scope of the invention.

What is claimed is:

1. Search and confirm frequency synthesizer apparatus comprising:
   first means for generating a reference frequency signal;
   second means for generating a comparison frequency signal;
   first spectrum generator means coupled to said first means for producing a plurality of harmonics of the reference frequency signal;
   second spectrum generator means coupled to said second means for producing a plurality of harmonics of the comparison frequency signal;
   a voltage controlled oscillator;
   phase detector means having a first input coupled to said first spectrum generator means, and a second input coupled to the output of said voltage controlled oscillator;
   loop filter and sweep generator means having a first input coupled to the output of said phase detector means, and an output coupled to the input of said voltage controlled oscillator to provide a phase-locked loop for sequentially generating at the output of said voltage controlled oscillator progressively increasing or decreasing harmonic frequencies of said reference frequency signal;
   frequency mixing means coupled to the output of said second spectrum generator means and to the output of said voltage controlled oscillator for mixing the plurality of harmonics of the comparison frequency signal with each sequentially generated harmonic of the reference frequency signal;
   filtering means coupled to the output of said frequency mixing means for transmitting only the single, lowest frequency difference signal produced by said mixing means;
   difference frequency counter means coupled to said filtering means for determining the frequency of said difference signal and for transmitting a numerical representation of the difference signal to a control circuit means; and
   said control circuit means coupled to said difference frequency counter means, and said loop filter and sweep generator means, and having an input to receive an encoded frequency select input signal for comparing the numerical representation of the difference signal with the encoded frequency select input signal, and for controlling the operation of said phase-locked loop to produce an output signal having a frequency equal to a selected harmonic of said reference frequency signal.

2. Search and confirm frequency synthesizer apparatus according to claim 2 wherein said control circuit means is further coupled to said comparison frequency generator means for turning on said comparison frequency generator means during changes in the output frequency of said frequency synthesizer.

3. Search and confirm frequency synthesizer apparatus according to claim 2 further including an amplifier means coupled between said filtering means and said difference frequency counter means for amplifying said difference signal.

* * * * *